Figure 1:
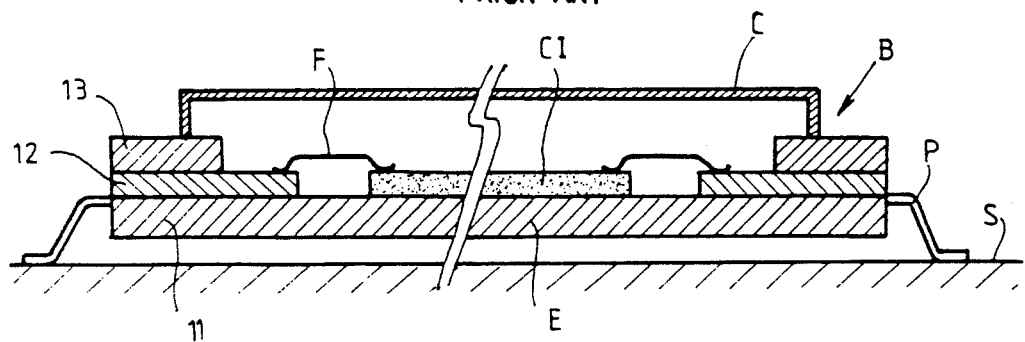

United States Patent [19]
Val

[11] Patent Number: 5,323,533
[45] Date of Patent: Jun. 28, 1994

[54] METHOD OF PRODUCING COAXIAL CONNECTIONS FOR AN ELECTRONIC COMPONENT, AND COMPONENT PACKAGE

[75] Inventor: Christian Val, St Remy les Chevreuses, France

[73] Assignee: Thomson-CSF, Puteaux, France

[21] Appl. No.: 949,558

[22] PCT Filed: Mar. 17, 1992

[86] PCT No.: PCT/FR92/00241
§ 371 Date: Nov. 10, 1992
§ 102(e) Date: Nov. 10, 1992

[87] PCT Pub. No.: WO92/17905
PCT Pub. Date: Oct. 15, 1992

[30] Foreign Application Priority Data

Mar. 26, 1991 [FR] France .................. 91 03624

[51] Int. Cl.5 ................ H05K 1/00; H05K 3/34
[52] U.S. Cl. ........................ 29/840; 29/828; 174/35 R; 174/260; 174/261; 257/684; 437/209; 437/211; 437/217; 361/760
[58] Field of Search ............ 361/324, 760; 29/825, 29/840, 828; 174/35 R, 260, 261; 437/209, 211, 217, 218; 257/684

[56] References Cited

U.S. PATENT DOCUMENTS 3,698,082 10/1972 Hyltin et al. .
4,417,392 11/1983 Ibrahim et al. .............. 29/840
4,483,067 11/1984 Parmentier .................. 29/840
4,776,087 10/1988 Cronin et al. .
4,959,900 10/1990 de Givry et al. ............ 29/840

FOREIGN PATENT DOCUMENTS

| 0183598 | 6/1986 | European Pat. Off. . . |
| 2573272 | 5/1986 | France . |
| 60-086852 | 5/1985 | Japan . |
| 62-119949 | 6/1987 | Japan . |
| 64-2399 | 1/1989 | Japan .................. 174/35 R |
| 2-60196 | 2/1990 | Japan .................. 29/825 |
| 3-206691 | 9/1991 | Japan .................. 361/424 |

OTHER PUBLICATIONS

IBM Technical Disclosure Bulletin vol. 27, No. 3, Aug. 1984 p. 1682 by M. P. Bourgeois et al.

Primary Examiner—Carl J. Arbes
Attorney, Agent, or Firm—Roland Plottel

[57] ABSTRACT

An object of the invention is the production of coaxial connections for the input/output links of the component and/or of the housing which encapsulates it.

More precisely, the component placed in a package (B), is conventionally connected by wires to its package; the wires are next covered by a first insulating layer (21) then by a second conducting layer (24) in such a way that this second layer is linked to the earth pads ($P_{E1}$) of the package. The layers (21, 24) thus form collectively-produced coaxial structures with the connection wires (F). A similar process is used for the input/output connections (P) of the package itself.

10 Claims, 3 Drawing Sheets

METHOD OF PRODUCING COAXIAL CONNECTIONS FOR AN ELECTRONIC COMPONENT, AND COMPONENT PACKAGE

An object of the present invention is a method of producing coaxial connections for an electronic component encapsulated in a package. A further object of the invention is a package comprising such connections.

In the present application, the term electronic component is understood to mean any discrete component or any integrated or hybrid circuit usable in electronics.

The increase in the speed of components and the rise in their working frequency which are currently observed mean that the links between components now have to be engineered, furthermore, in terms of energy propagation.

In particular, in order to avoid any signal reflection, the impedance of the propagation medium of this signal must be constant. However, although it is known how to achieve this for a package, it is noticeable that this is not the case for the links both of the package with the printed circuit on which it is mounted, and of the package with the component: in fact, parasitic reflections of part of the energy are experimentally observed at these sites.

The present invention makes it possible to avoid these difficulties by using coaxial lines formed collectively after wiring for the input/output connections of the component and/or of the package.

More precisely, the component, placed in a package, is conventionally connected by wire to its package; the wires are next covered by a first insulating layer, then by a second conducting layer, in such a way that this second layer is linked to the earth pads of the package, the layers thus forming coaxial-structure electrical connections with the wires. A similar process is carried out for the input/output connections of the package.

Figure 4:
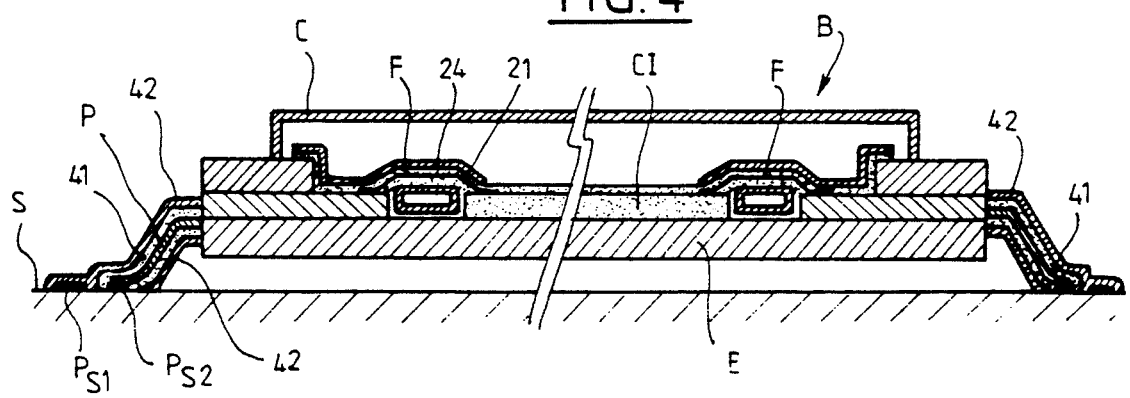
Figure 2A:
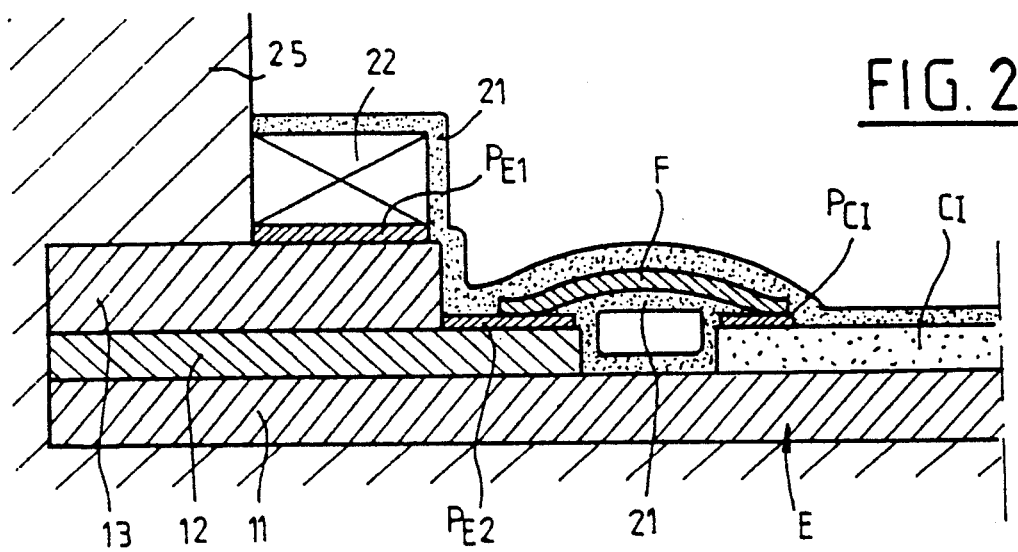
Figure 2B:
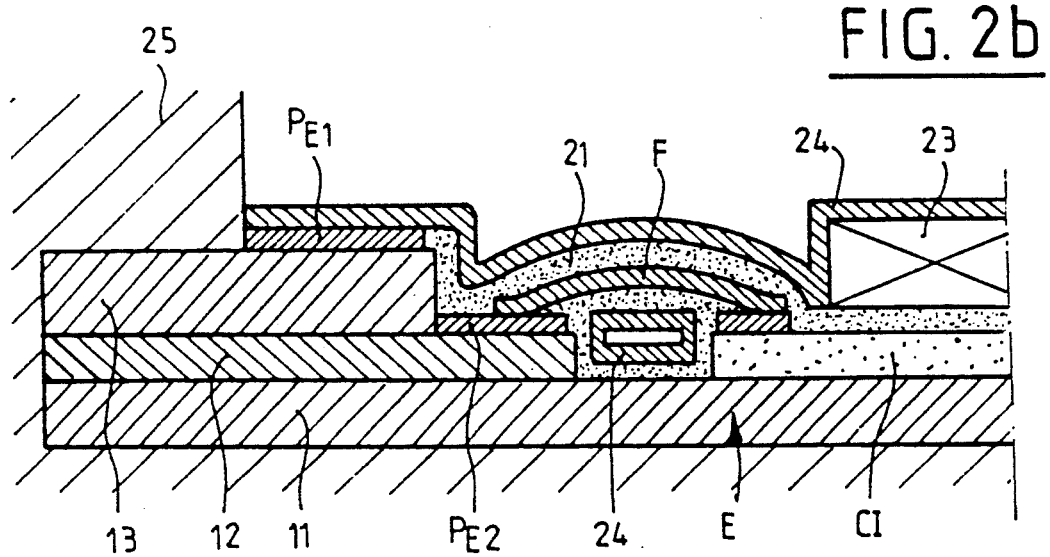
Figure 2C:
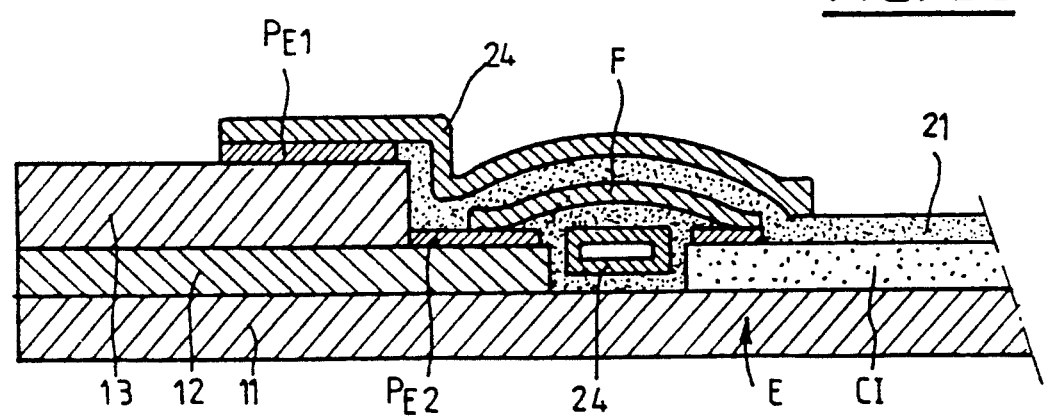

Other objects, features and results of the invention will emerge from the following description, illustrated by the attached drawings, which represent:

FIG. 1, a sectional view of a component conventionally encapsulated in a package, itself transferred to a printed circuit;

FIGS. 2a, 2b and 2c, various steps of a first embodiment of the method according to the invention, applied to the inputs/outputs of the component;

FIGS. 3a, 3b, 3c and 3d, various steps of another embodiment of the method according to the invention, still applied to the inputs/outputs of the component;

FIG. 4, an embodiment of the method according to the invention applied to the input/output connections of the package.

On these various figures, the same references refer to the same elements. Moreover, the real scale has not been adhered to, for the clarity of the drawings.

FIG. 1 thus represents a sectional view of an electronic component conventionally encapsulated in a package, itself transferred to a printed circuit.

The component indexed CI is arranged, for example by soldering or bonding, onto a base E, which is itself covered by a cap C: the base E and cap C assembly forms a package B, hermetically encapsulating the component CI. The base E is, for example, made of ceramic and comprises, for example, three layers: a first layer 11, bearing the component CI covered by a layer 12 annularly surrounding the component CI, then by a layer 13 also annularly surrounding the component but set back with respect to the layer 12, the cap being arranged on the layer 13.

On this figure are further shown connection wires F linking the input/output pads (not shown) of the component to pads of the package which are situated on one of the layers of the base, for example the layer 12 on the figure. Pins indexed P are also represented, forming the input/output connections of the package and allowing the latter to be electrically linked to one or more external circuits, typically by the intermediary of a substrate S such as a printed circuit. The pins P are conventionally linked to the pads of the package by metallised tracks and holes, which are also not shown.

FIGS. 2a, 2b and 2c represent various steps of a first embodiment of the method according to the invention, applied to the inputs/outputs of the component CI. In these various figures, only the part of FIG. 1 concerned by the connection of a wire such as F is represented.

Thus in FIG. 2a is represented the base E of the package bearing the component CI and constituted by its three layers 11, 12 and 13. A wire F connects a pad $P_{CI}$ of the component CI to a pad of the base, indexed $P_{E2}$ and arranged, for example, on the layer 12; the wire F is, in general, made of gold or aluminum. The base further comprises pads intended to supply the reference voltage, or earth, for the component CI, an example of which is represented by $P_{E1}$ and arranged on the layer 13.

According to the invention, a layer of an insulating material 21 is deposited on the component-base-wire assembly F, except on the earth pad $P_{E1}$. This exempting of the earth pad $P_{E1}$ is produced, for example, as represented in FIG. 2a, that is to say by use of a mask 22 arranged in advance on the pad $P_{E1}$, or also by later etching of the layer 21. Furthermore, the outside of the base E from the pad $P_{E1}$, namely the left part of the figure and the underside of the base, is also protected from the deposition 21 by any known means (25) such as foam, elastomer or varnish. The insulating layer 21 and its deposition technique must be chosen in such a way that the layer can be deposited as represented in the figure, all around the wire F and over the whole of the base with a fairly uniform, fine and controllable thickness. Furthermore, the material forming the layer 21 is preferably chosen from among those whose dielectric constant varies little or not at all with the temperature and the frequency. By way of example, a material manufactured by the UNION CARBIDE company known by the name of "parylene" (poly-paraxylylene-based thermoplastic polymer), deposited by condensation under reduced pressure, is suitable; in fact, its dielectric constant is 2.65 for N-type "parylene", which makes it possible, for example, to deposit it with a thickness of the order of 35 m around a wire F of 25 μm diameter and thus to obtain a characteristic line impedance of 50 ohms, which is the impedance usually adopted for connections inside the package. Needless to say, various other materials, especially of the plastic type may be suitable, such as C-"parylene" or epoxy. It will be recalled that the relation giving the characteristic impedance $Z_c$ of a coaxial-structure electrical connection line is as follows:

$$Z_c = \frac{138}{\sqrt{\epsilon_r}} \cdot \log_{10}\frac{r_2}{r_1}$$

where:

$\epsilon_r$ is the relative dielectric constant of the insulating material;

$r_1$ is the radius of the inner conductor;

$r_2$ is the radius of the cylinder formed by the outer surface of the insulating material.

In FIG. 2b the base E and its component CI can be seen after removal of the mask 22: the insulating layer 21 thus stops flush with the pad $P_{E1}$. The following step consists in again depositing a conducting layer 24 on the component CI-base-wire F assembly, but preferably not on the component 23, so as to avoid capacitive couplings between the conducting areas of the component. As before, this exempting is brought about either by the use of a mask (23, FIG. 2b), or by etching. The deposition 24 is carried out, for example, by cathodic pulverisation in a vacuum, a technique which allows all the surface in question to be well covered. The choice of the material deposited depends especially on the type of application envisaged; by way of example, copper, nickel, a copper-nickel, chrome-gold, nickel-chrome-gold or aluminium alloy may be used. In the context of the preceding numerical example, a layer 24 of 1 to 2 m may be sufficient.

The next step, illustrated in FIG. 2c, consists in removing the mask 23, the layer part 24 which is attached to it and its protection 25; and it will be seen that the wire F is converted, by the two successive deposits, into a coaxial-type connection the central conductor of which is formed by wire F and whose outer conductor is formed by the conducting layer 24, which is connected to the earth pad $P_{E1}$.

In one variant embodiment (not shown) the layer 24 may be connected to several earth pads of the package, such as $P_{E1}$. In another variant (also not represented), a supplementary conductor ring is available on the base, for example on the layer 13 at its periphery, linked to the earth and to which the layer 24 is linked, for example at several points, instead and in place of the pad $P_{E1}$.

FIGS. 3a, 3b, 3c and 3d represent various steps of another embodiment of the method according to the invention, still applied to the inputs/outputs of the component. This embodiment differs essentially from that of FIG. 2 by the production of the earthing of the outer conductor of the coaxial structure.

Figure 3A:
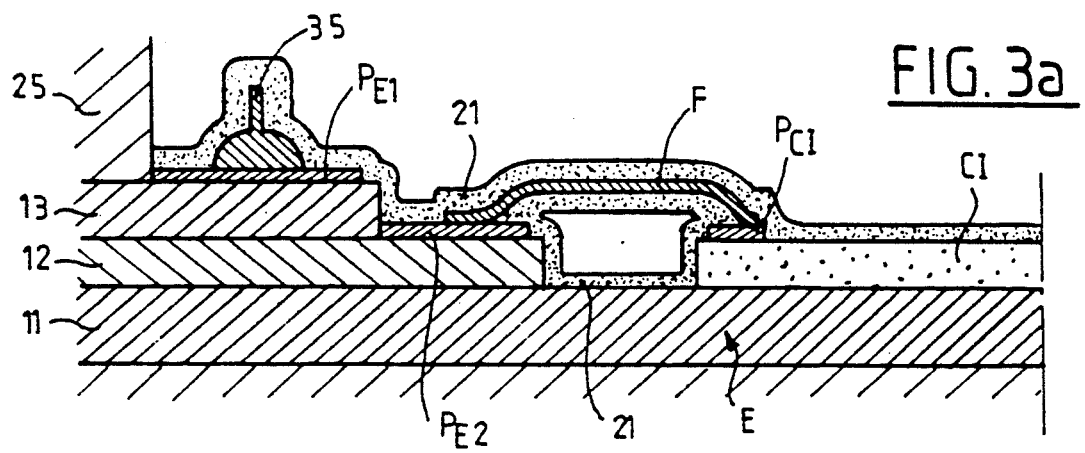

More precisely, in a first step illustrated in FIG. 3a, instead of arranging a mask (22, FIG. 2a) on the earth pad $P_{E1}$ of the base E, a wire 35 is connected thereto, substantially normal to the pad, a wire made of gold, for example, which is sectioned at a fairly low height, then in a second step a layer 21 of an insulating material is deposited as before, preferably the same material according to the same technique as described above; this layer 21 then covers the component CI, the base E, the wire F over its whole surface, the pads $P_{E2}$ and $P_{E1}$ of the base as well as the wire 35.

Figure 3B:
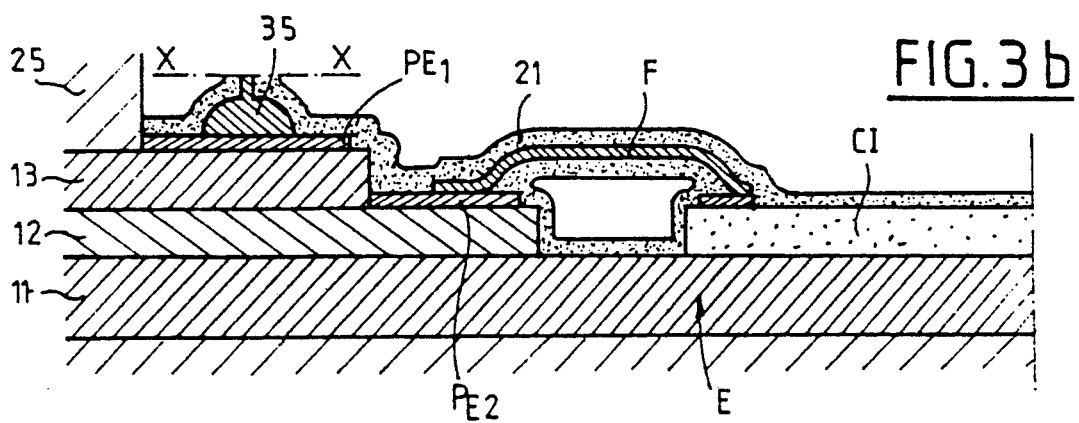
Figure 3C:
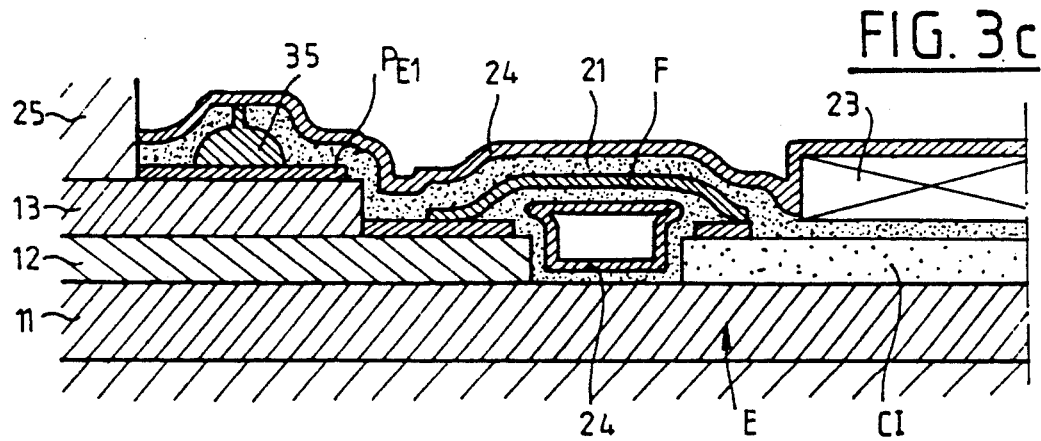

In the following step illustrated in FIG. 3b, the layer 21 is sectioned at right angles to the wire 35 in such a way that the latter is flush as shown by a line XX.

In a later step, (FIG. 3c), a layer of a conducting material 24 is deposited on the previously-obtained assembly except, as before, on the component Cl; the latter is, for example, protected by a mask 23. The layer 24 thus covers the mask 23, the whole outer (insulating) surface of the wire F as well as the section of the pad 25.

Figure 3D:
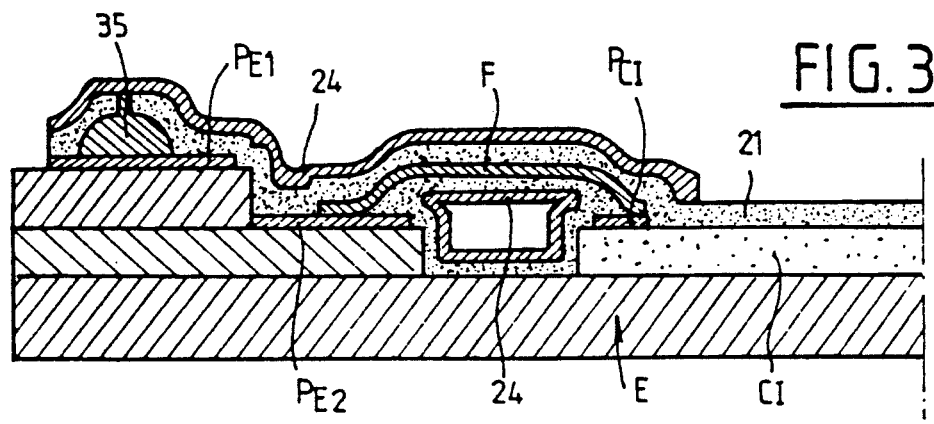

Finally, as illustrated in FIG. 3d, the mask 23, the metallic layer which is attached to it and its protection 25 are lifted off. A coaxial-type connection (central conductor: wire F; outer conductor: layer 24) is thus obtained between the component Cl and the base, the central conductor being connected to the pad $P_{E2}$ of the base and the outer conductor (24) to the pad $P_{E1}$ by the intermediary of the conductor 25.

FIG. 4 represents an embodiment of the method according to the invention, applied to the input/output connections P of the package B.

In this figure, the base E of the package B bearing the component Cl is again found, the component being connected to the base via wires F (represented by a thick line) converted into coaxial connections as described above, by the layers 21 and 24. The component Cl is enclosed by a cap C, for example metal, resting on the base E.

According to the invention, a coaxial structure is formed around each of the connection pins P of the package B in a way similar to that which is described above for the wires F.

To this end, a first layer of insulating material 41 is deposited on the pins P; in a variant (not shown), each layer 41 may extend over the whole of the package; as before, the insulating material is advantageously "parylene", deposited by condensation under reduced pressure. In a following step, a second layer of conducting material, indexed 42, is deposited on the part of the layer 41 which surrounds the pins P, in such a way as to constitute, with each of the pins P, a coaxial connection structure. Here again, the conducting layer 42 may extend over the whole of the package, in one variant embodiment (not shown). The material constituting the layer 22 may advantageously be the same as that constituting the layer 24 of the preceding figures.

According to a preferred embodiment, these depositions 41 and 42 are carried out after mounting the box B on its printed circuit S and connection of the pins P to pads $P_{S2}$ of the circuit S. In this case, means are provided (mask or etching) so that the pads $P_{S1}$ situated in proximity to pads $P_{S2}$ and linked to earth are exempted, during deposition of the insulating layer 41; deposition of the layer 42 then extends as far as the pads $P_{S1}$, as represented in FIG. 4.

A method has thus been described making it possible to transform simple connections (wires F, pins P) in situ into coaxial links and to do so collectively and thus economically, which makes it possible to obtain the characteristic impedances desired by choice of materials and thickness.

The description given above was, needless to say, by way of non-limiting example. Thus, for example, the base E of the package B has been mentioned as being made of ceramic, but it may equally be made of metal or plastic, as can the cap C. Thus also the wires F and the pins P may be of circular cross-section or be constituted by wires, or strips, of rectangular cross-section.

I claims:

1. Method of producing connections for an electronic component (Cl) placed on a base (E) of a package (B), the base (E) further comprising input-output connection pins (P), the method being characterised in that it successively comprises the following steps:

a first step of electrical linking of each pad ($P_{Cl}$) of the component (Cl) to a pad ($P_{E2}$) of the base (E) by means of a wire (F);

a second step of depositing a layer (21; 41) of an electrically-insulating material on the wires (F) and at least those of the pads ($P_{E2}$) of the base to which the wires are linked, and/or on the pins (P) of the package;

a third step of depositing a layer (24; 42) of electrically-conducting material on the part of the insulating layer which covers the wires (F) and/or the pins (P), the conducting layer being linked to a reference potential, the said insulating and conducting layers thus forming with the wires and/or the pins coaxial-structure electrical connections.

2. Method according to claim 1, characterised in that the deposition of a layer of an electrically-insulating material is carried out by condensation at reduced pressure.

3. Method according to claim 1, characterised in that the insulating material is parylene.

4. Method according to claim 1, characterised in that the deposition of a layer of electrically-conducting material is carried out by cathodic pulverisation in a vacuum.

5. Method according to claim 1, characterised in that the conducting material comprises copper, nickel, chrome, gold, nickel or aluminium or a composite of these metals.

6. Method according to claim 1, characterised in that the conducting layer (24) which covers the wires (F) covers at least one pad ($P_{E1}$) of the base which is linked to the reference potential.

7. Method according to claim 6, characterised in that it comprises, before the second step, a supplementary step of connecting, to the pad assigned to the reference potential ($P_{E1}$), a wire (35) which is substantially normal to the pad.

8. Method according to claim 1, characterised in that the second and third steps are carried out after connection of the pins (P) of the base to an external circuit.

9. A package comprising a base (E) bearing an electronic component (C1) and a cap (C) arranged on a base, with pads ($P_{C1}$) of the component being connected to pads ($P_{E2}$) of the base by conducting wires (F); the package being characterized in that the wires are covered by a layer (21) of an insulating material and the latter by a layer (24) of a conducting material, the conducting layer being linked to a reference potential, and the electrical connections of the component to the base thus having a coaxial structure.

10. A package comprising a base (E) bearing an electronic component (C1), a cap (C) arranged on the base and having input-output connection pins (P); the package being characterized in that the pins are covered by a layer (41) of an insulating material and the latter by a layer (42) of a conducting material, the conducting layer being linked to a reference potential, and the connection pins of the package thus having a coaxial structure.

* * * * *